(12) United States Patent
Buchanan et al.

(10) Patent No.: US 9,847,126 B2
(45) Date of Patent: Dec. 19, 2017

(54) INCREASING A READ MARGIN IN A READ CELL

(71) Applicant: Hewlett Packard Enterprise Development LP, Houston, TX (US)

(72) Inventors: Brent Buchanan, Fort Collins, CO (US); R. Stanley Williams, Portola Valley, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/325,358

(22) PCT Filed: Oct. 24, 2014

(86) PCT No.: PCT/US2014/062158
§ 371 (c)(1),
(2) Date: Jan. 10, 2017

(87) PCT Pub. No.: WO2016/064416
PCT Pub. Date: Apr. 28, 2016

(65) Prior Publication Data
US 2017/0200496 A1    Jul. 13, 2017

(51) Int. Cl.
*G11C 11/00* (2006.01)
*G11C 13/00* (2006.01)
*G11C 11/16* (2006.01)

(52) U.S. Cl.
CPC ........ *G11C 13/004* (2013.01); *G11C 11/1673* (2013.01); *G11C 13/0002* (2013.01); *G11C 13/0007* (2013.01); *G11C 2013/0045* (2013.01); *G11C 2013/0054* (2013.01)

(58) Field of Classification Search
CPC ............ G11C 13/0007; G11C 13/0002; G11C 13/0069; G11C 13/0004; G11C 2013/0078; G11C 13/004; G11C 2013/0092; G11C 7/00; G11C 2013/0076; G11C 2213/32; G11C 2213/72; G11C 2213/77
USPC ............ 365/148, 163, 175, 189.011, 189.14, 365/189.16, 51
See application file for complete search history.

(56) References Cited

U.S. PATENT DOCUMENTS

| 5,485,119 A | 1/1996 | Kimura |
| 7,397,696 B1 | 7/2008 | Wadhwa et al. |
| 2006/0050584 A1 | 3/2006 | Gogl et al. |

(Continued)

OTHER PUBLICATIONS

Carlson, A. et al., SRAM Read/write Margin Enhancements Using FinFETs, Jun. 2010, IEEE Transactions on Very Large Scale Integration (VLSI) Systems, vol. 18, No. 6, 14 Pgs.

(Continued)

*Primary Examiner* — Thong Q Le
(74) *Attorney, Agent, or Firm* — Fabian VanCott

(57) ABSTRACT

A method of increasing a read margin in a memory cell may include sensing an input current created from the application of a read voltage across a memristive device, squaring the input current, and comparing the squared input current to a reference current. A memristive device may include a memristor and a sense amplifier communicatively coupled to the memristor wherein a sensed input current created from the application of a reference voltage across a memristor is squared and wherein the sense amplifier compares the squared input current to a reference current.

18 Claims, 5 Drawing Sheets

(56) References Cited

U.S. PATENT DOCUMENTS

| | | | |
|---|---|---|---|
| 2007/0036008 A1 | 2/2007 | Park et al. | |
| 2007/0236987 A1 | 10/2007 | Cho et al. | |
| 2010/0067289 A1 | 3/2010 | Fuji | |
| 2011/0286259 A1 | 11/2011 | Perner | |
| 2012/0011092 A1* | 1/2012 | Tang | G06N 3/049 706/33 |
| 2013/0028015 A1 | 1/2013 | Matsui | |
| 2013/0223132 A1 | 8/2013 | Perner | |
| 2013/0279237 A1 | 10/2013 | Huang et al. | |
| 2017/0213590 A1* | 7/2017 | Muralimanohar | G11C 13/004 |

OTHER PUBLICATIONS

International Searching Authority, The International Search Report and the Written Opinion, PCT/US2014/062158, dated Jun. 26, 2015, 10 Pages.

* cited by examiner

INCREASING A READ MARGIN IN A READ CELL

BACKGROUND

Devices that store their value as a resistance such as memristors may be used in memory devices of a computing system to store data. Data stored may be retrieved from the memristor as a voltage is applied to it. The current detected may indicate either a relatively high resistive state or a relatively low resistive state. Each of these states includes a current associated with them and these currents are compared to a reference current to determine the state of the memristor.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
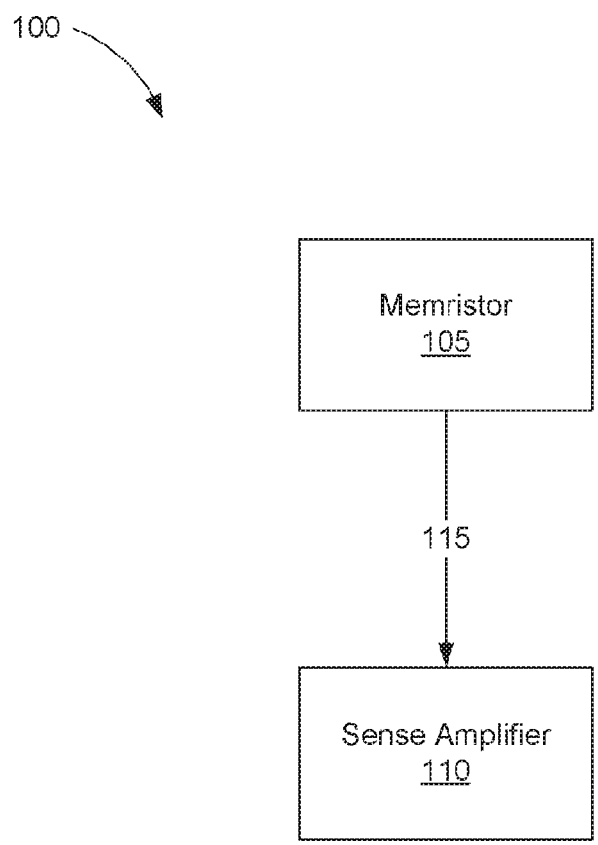
FIG. 1 is a block diagram of a memristive device according to one example of the principles described herein.

As described above, devices that store their value as a resistance such as memristors may be used to store data. In a memristor, for example, if charge flows in one direction through the memristor, the resistance of that memristor will increase creating a high resistance state. Additionally, if charge flows in the opposite direction in the memristor, the resistance will decrease creating a low resistance state. The detection of these two states may be used to determine whether a "1" or a "0" bit has been stored on that device.

As a read voltage is applied to the memristor, a resulting current may be sensed and compared to a reference current. Due to the properties of the materials used as well as other factors, the distribution of the sensed current (i.e., low resistive state current or high resistive state current) may not fall exactly on a specific value. Instead, there may be a distribution curve around a value for each of the low resistive state current, high resistive state current, and the reference current. The separation of the values associated with these distribution curves is called the read margin.

Where the distribution curves for each of these currents are sufficiently separated (i.e., a relatively large read margin), the state of the memristive device may be read. However, if the distribution curves were to overlap (i.e., the read margin is relatively smaller) it may be more difficult to determine what state was intended to be written into the memristor. This may result in a failed attempt to retrieve any portion of data stored on the memory device implementing the memristor.

The present specification describes a method of increasing a read margin in a memory cell. The method may include sensing an input current created from the application of a read voltage across a memristive device, squaring the input current, and comparing the squared input current to a reference current. In this way, a read margin will be increased due to the squaring of the current sensed.

The present specification also describes a memristive device may include a memristor, and a sense amplifier communicatively coupled to the memristor wherein a sensed input current created from the application of a reference voltage across a memristor is squared and wherein the sense amplifier compares the squared input current to a reference current.

The present specification further describes a memory device, including a memristive device, a current mirror electrically coupled to the memristive device, and a field-effect transistor electrically coupled to the current mirror wherein a sensed input current through the memristive device is mirrored on the current mirror after the application of a reference voltage to the memristive device. A bias current is applied to the mirrored side of the current mirror such that a total voltage across a resistor on the mirrored side of the current mirror is the sum of a threshold voltage and a gate voltage of a field-effect transistor and a resulting channel current through the drain of the field-effect transistor is a function of the sense current squared.

As used in the present specification and in the appended claims, the term "memristive device" is meant to be understood broadly as any device that stores a value as a resistance. In one example, a memristive device may be a passive two-terminal electronic device that is built to express only the property of memristance. In another example, the memristive device may be a unipolar resistive random-access memory (RRAM). In yet another example, the memristive device may be a phase change random-access memory (PCRAM).

As used in the present specification and in the appended claims, the term "memristance" is meant to be understood as a property of an electronic component such that 1.) bipolar switching—an electronic charge that flows in one direction through a circuit creates an increased resistance while if charge flows in the opposite direction in the circuit, the resistance will decrease, or 2.) unipolar switching—a current of a particular magnitude flowing in either direction creates an increased resistance while a current of a different magnitude flowing in either direction causes a decreased resistance. If the flow of charge is stopped by turning off the applied voltage, the component will 'remember' the last resistance that it had, and when the flow of charge starts again the resistance of the circuit will be what it was when it was last active.

Additionally, as used in the present specification and in the appended claims, the terms "square," "squared," or "squaring" are to mean an a number multiplied by itself or multiplying a number by itself.

Further, as used in the present specification and in the appended claims, the term "a number of" or similar language is meant to be understood broadly as any positive number 1 to infinity.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

Turning now to the figures, FIG. 1 is a block diagram of a memristive device (100) according to one example of the principles described herein. Although FIG. 1 shows a memristor, the present specification contemplates the use of any device that may store a value as a resistance for later retrieval by a computing device. The present specification, to make the discussion clear, uses a memristor as an example.

The memristive device (100) includes a memristor (105) and a sense amplifier (110) in electrical communication with the memristor (105). The memristive device (100) may be used in any non-volatile memory storage device. Additionally, the memristive device (100) may be combined with a number of other memristive devices (100) to form a bank of memristive devices to store any amount of data.

The memristive device (100) may be electrically coupled to a sense amplifier (110) that receives a squared current (115) from the memristor (105) when a voltage is applied to the memristor (105). In one example, the voltage applied to the memristor (105) is a read voltage sufficient to read the resistive state of the memristor (105). As described above, this is done so as to determine if the memristor (105) is in a high resistive state or low resistive state. In the case where the memristor (105) is in a high resistive state, a squared high resistive state current is sensed by the sense amplifier (110) when the read voltage is applied to the memristor (105). In the case where the memristor (105) is in a low resistive state, a squared low resistive state current is sensed by the sense amplifier (110) when the read voltage is applied to the memristor (105).

As will be described in more detail below, the memristive device (100) may square the high resistive state current or low resistive state current before inputting that current into the sense amplifier (110). The sense amplifier (110) may then compare the squared current to a predefined reference current. The reference current may be dependent on the properties of the memristor (105) and may be adjusted based on those properties.

Figure 2:
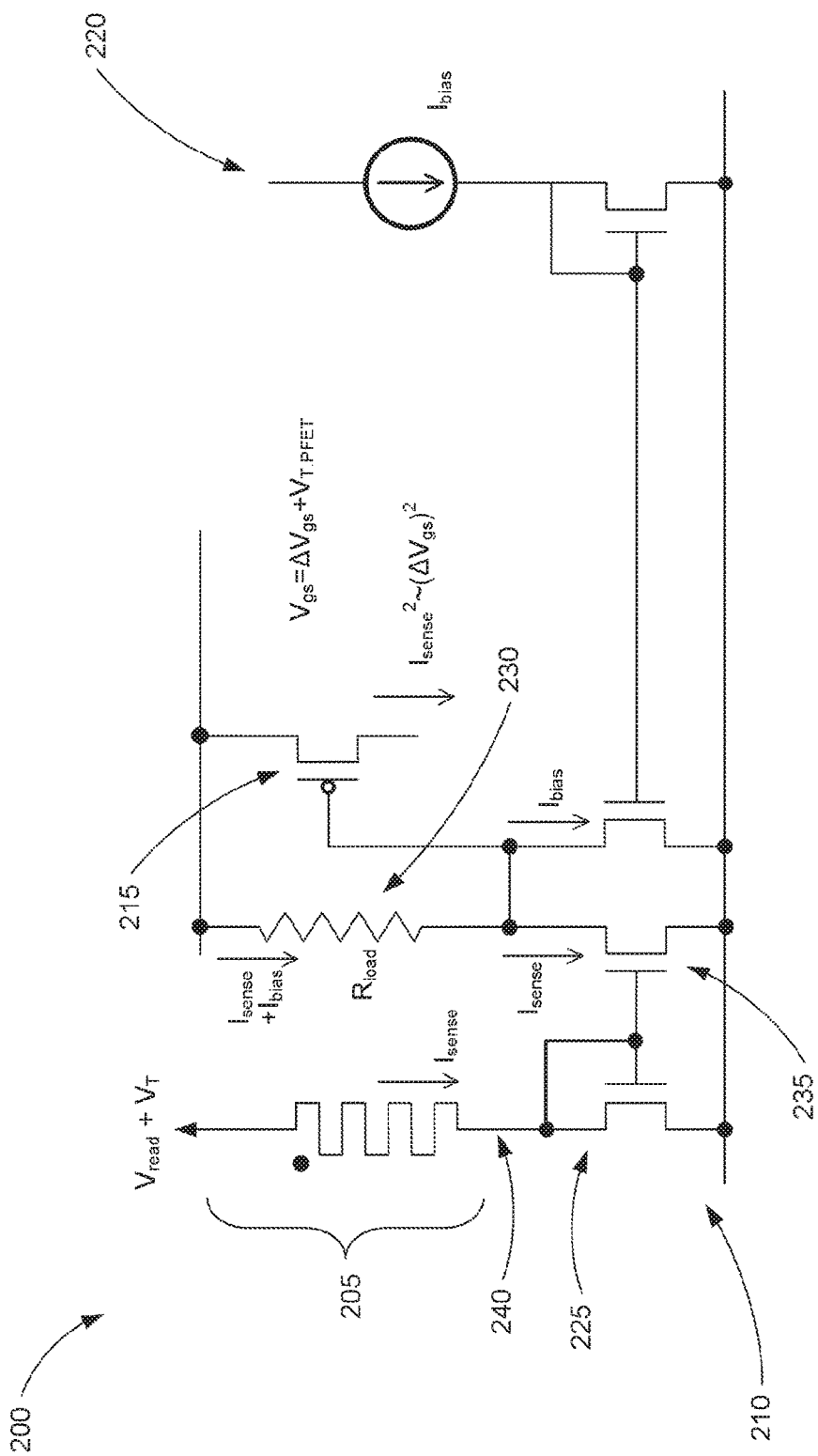
FIG. 2 is a circuit diagram of a memory device according to one example the principles described herein.

In order to square the current output from the memristor (105) upon application of the read voltage, the memristive device (100) may include additional components such as those shown in FIG. 2. FIG. 2 is a circuit diagram of a memory device (200) according to one example the principles described herein. Although FIG. 2 shows a number of electrical components arranged in a specific manner, FIG. 2 is merely an example of a circuit that may be used to increase a read margin. Consequently, the present specification contemplates the use a number of different electrical components arranged in a number of configurations.

Memory device (200) includes a memristor (205), a current mirror (210), a p-channel field-effect transistor (215), and a sense amplifier (220). These components will now be described in more detail. The memristor (205) may be similar to the memristor (FIG. 1, 105) described above in connection with FIG. 1. During operation of the memory device (200), a read operation is conducted on the memristor (205) by applying a read voltage ($V_{read}$) across the memristor (205). A current ($I_{sense}$) is produced and input into the input side of the current mirror (210).

In one example, a voltage clamp (240) may be added at the interface between the memristor (205) and the input of the current mirror (210). The voltage clamp (240) may clamp or hold the voltage at a set level. In one example, the voltage at which the voltage clamp (240) holds is about equal to a threshold voltage ($V_T$).

In one example, the current mirror (210) includes a first negative channel field effect transistor (nFET) (225) into which the sensed current ($I_{sense}$) is input. The current ($I_{sense}$) is mirrored on a second negative channel field effect transistor (nFET) (235). The current mirror (210) also includes a resistor (230) on the mirrored side of the current mirror (210). Again, during operation of the memory device (200) the current ($I_{sense}$) runs through the mirrored side of the current mirror (210). A bias current ($I_{bias}$) is added to the sensed current ($I_{sense}$) and is set such that the bias current ($I_{bias}$) multiplied by the load of the resistor ($R_{load}$) equals a threshold voltage ($V_T$):

$$(R_{load})*(I_{bias})=(V_T) \quad \text{(Equation 1)}$$

The bias current ($I_{bias}$) draws enough current through the resistor ($R_{load}$) (230) to bias a p-Channel Field-effect transistor (PFET) (215) such that any additional current through the resistor ($R_{load}$) (230) raises the PFET's (215) gate voltage above the threshold ($V_T$) value.

Since $I_{sense}$ and $I_{bias}$ add together linearly, a voltage associated with both the bias current ($I_{bias}$) and sensed current ($I_{sense}$) can be calculated individually, leading to:

$$(R_{load})*(I_{sense})=\Delta V_{gs} \quad \text{(Equation 2)}$$

where $\Delta V_{gs}$ is the gate voltage above the threshold voltage ($V_T$). The magnitude of the gate voltage ($V_{gs}$) above the threshold voltage ($V_T$) is caused by the sensed current ($I_{sense}$) flowing across the resistor (230).

The Shichman-Hodges equation for a FET in saturation shows that the channel current is proportional to the square of the gate voltage ($V_{gs}$) minus the threshold voltage ($V_T$), or $V_{gs}$. Substituting equation 2 for $V_{gs}$ indicates that the channel current is proportional to the square of the sensed current ($I_{sense}$):

$$I_{ds}=k'(W/L)(V_{gs}-V_T)^2=k'(W/L)(R_{load} \cdot I_{sense})^2 = a \cdot I_{sense}^2 \quad \text{(Equation 3)}$$

where "a" and "k'(W/L)" are constants. As a result, the gate voltage of a field-effect transistor (215) ($V_{gs}$) electrically coupled to the current mirror (210) minus the threshold voltage ($V_T$) equals the gate voltage above the threshold voltage $\Delta V_{gs}$.

The squared sense current ($I_{sense}^2$) may now be sent through a sense amplifier (220) to be compared to a reference current ($I_{ref}$). Because the sensed current ($I_{sense}$) has been squared, the read margin between the low resistive state current ($I_{LRS}$) and the reference current ($I_{ref}$) and that of the high resistive state current ($I_{HRS}$) and the reference current ($I_{ref}$) is relatively larger. The enhanced read margin contributes to sensing reliability. Additionally, any spare read margin may be traded for speed, area, power, and simplicity, among others. Further, the memory device described herein may enable the reliable use of memory cells that would not otherwise have a sufficient read margin to determine what bit is stored thereon.

Figure 3:
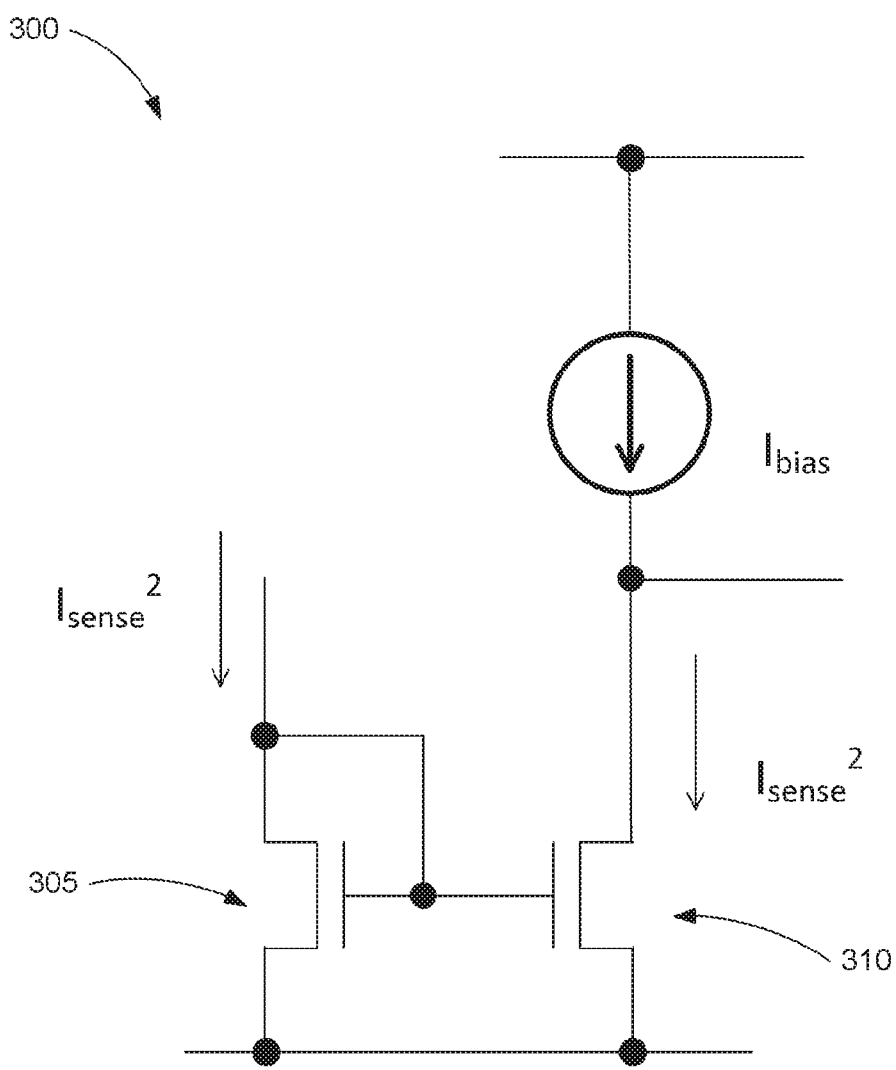
FIG. 3 is a circuit diagram of a sense amplifier according to one example the principles described herein.

FIG. 3 is a circuit diagram of a sense amplifier (300) according to one example of the principles described herein. The sense amplifier (300) may receive the squared sense current ($I_{sense}^2$) created by the circuit described in FIG. 2 and compare that squared sense current ($I_{sense}^2$) to a reference current ($I_{ref}$). In this example, the sense amplifier (300) includes a first (305) and second (310) negative channel field effect transistor (nFET).

Figure 4:
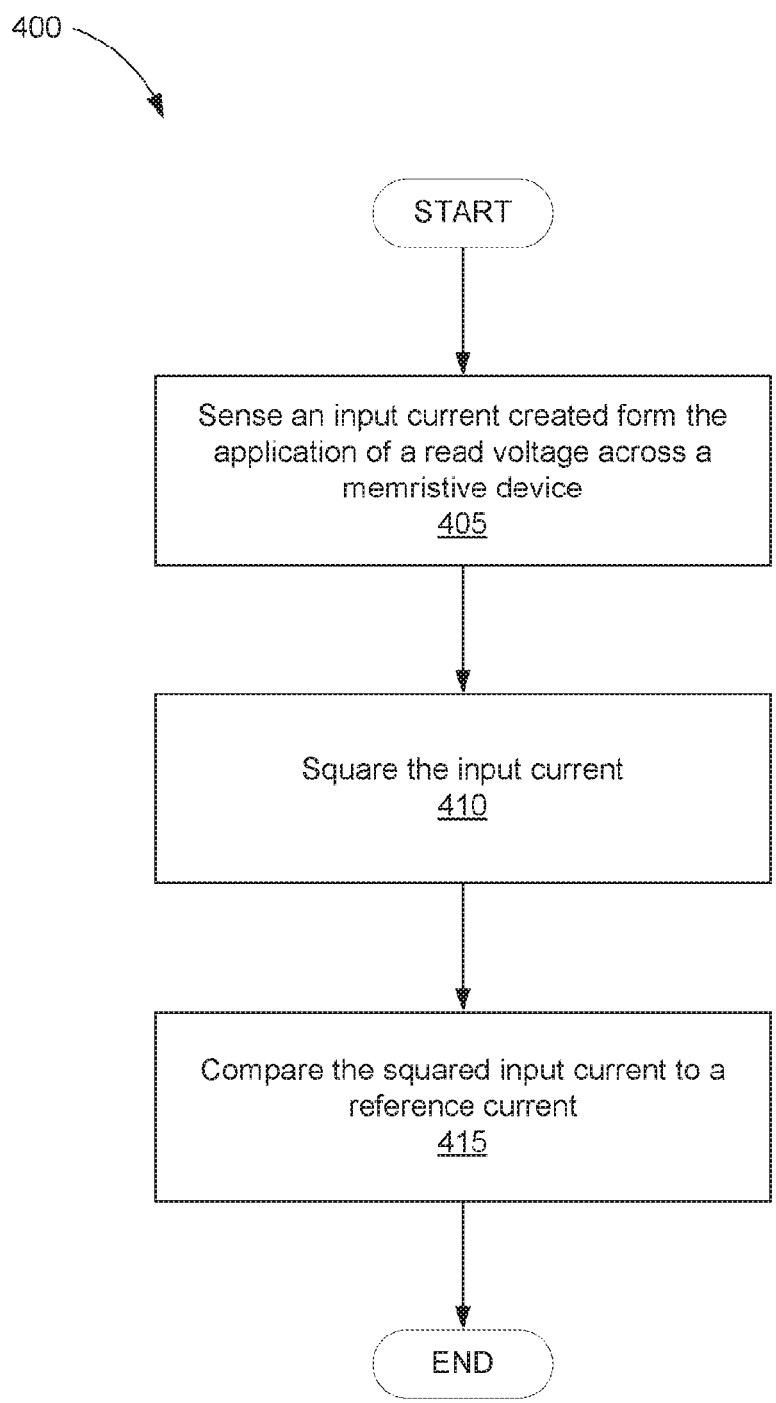
FIG. 4 is a flowchart showing a method of increasing a read margin in a memory cell according to one example of the principles described herein.

FIG. 4 is a flowchart showing a method (400) of increasing a read margin in a memory cell according to one example of the principles described herein. The method (400) may begin with sensing (405) an input current created from the application of a read voltage ($V_{read}$) across a memristor (FIG. 1, 105; FIG. 2, 205). The read voltage ($V_{read}$) may be a voltage sufficient to read the resistive state of the memristor (FIG. 1, 105; FIG. 2, 205). This creates a sense current ($I_{sense}$) to be input into a current mirror (210) and squared (410). As described above in connection with FIG. 2, the squaring (410) of the sense current ($I_{sense}$) may be accomplished using the current mirror (210), a resistor (230), and a field-effect transistor (215).

The squared input current may be input into a sense amplifier (FIG. 2, 220; FIG. 3, 300). The sense amplifier (FIG. 2, 220; FIG. 3, 300) may receive the squared input current and compare (315) the squared input current to a reference current ($I_{ref}$). As a result of squaring (410) the input current the read margin may be increased between the reference current ($I_{ref}$) and the squared input current. This enhanced read margin improves the ability of the sense amplifier (FIG. 2, 220; FIG. 3, 300) to read data stored on the memory cell during a read operation.

Figure 5A:
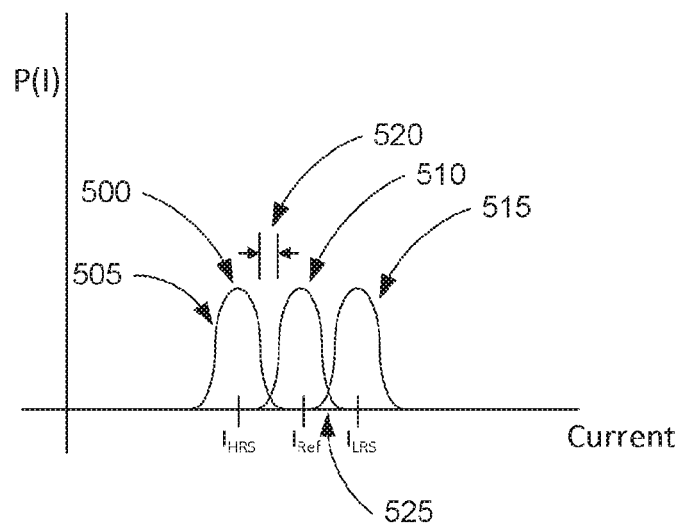
FIGS. 5A and 5B are graphs depicting two examples of a read margin according to one example of the principles described herein.
Figure 5B:
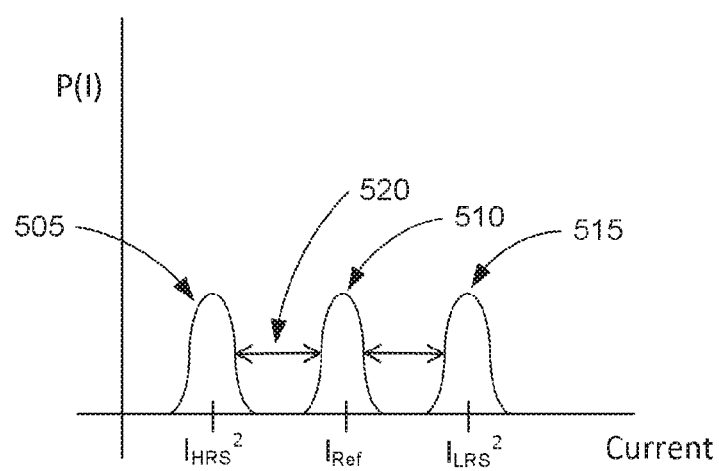

FIGS. 5A and 5B are graphs depicting two examples of a read margin according to one example of the principles described herein. As briefly described above, as a memristor (FIG. 1, 105; FIG. 2, 205) is written to, the memristor (FIG. 1, 105; FIG. 2, 205) is placed in either a high resistive state or a low resistive state. The high and low resistive states may be set to be a fixed value such as 1 MΩ for the high resistive state and 1 KΩ for the low resistive state. However, due to the properties of the materials used to build the memristor (FIG. 1, 105; FIG. 2, 205) the low and high resistive states may vary causing a distribution generally centered around the intended values. FIG. 5A shows such a distribution (500) along an increasing current line. The distribution of the high resistive state current (505), the reference current (510), and the low resistive state current (515) has a relatively small read margin (520). In some cases, overlap (525) may occur causing, in some instances, the inability to determine what state was intended to be written into the memristor (FIG. 1, 105; FIG. 2, 205), thereby failing to adequately read data from the memristor (FIG. 1, 105; FIG. 2, 205).

FIG. 5B depicts another set of high resistive state current (505), low resistive state current (515), and reference current (515) distributions. Because the currents have been squared for the high resistive state current (505) and the low resistive state current (515), the read margin (520) is relatively larger providing greater delineation between the high resistive state current (505) and the reference current (510) and between the low resistive state current (515) and the reference current (510).

Aspects of the present circuit and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor of a computer or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The specification and figures describe a method of increasing a read margin of a memory cell. The method may include sensing a current from a memristor and squaring that current. A comparison of the current to a reference current may then be made to determine the state of the memristor. A sensing current may be used to make the comparison. This method may have a number of advantages, including providing a relatively larger read margin. A read margin directly contributes to sensing reliability and any spare read margin can be traded for speed, area, power, and simplicity, among others. Additionally, application of this method may enable the reliable use of a memory cell that would otherwise be unusable due to an insufficient read margin.

The preceding description has been presented to illustrate and describe examples of the principles described. This description is not intended to be exhaustive or to limit these principles to any precise form disclosed. Many modifications and variations are possible in light of the above teaching.

What is claimed is:

1. A method of increasing a read margin in a memory cell, comprising:
   sensing an input current created from the application of a read voltage across a memristive device;
   squaring the input current; and
   comparing the squared input current to a reference current.

2. The method of claim 1, further comprising inputting the input current into an input side of a current mirror.

3. The method of claim 2, further comprising adding a bias current to the input current mirrored on the current mirror and causing the sum of the bias current and mirrored input current to pass through a resistor.

4. The method of claim 3, wherein the total voltage across the resistor comprises the threshold voltage and a gate voltage of a field-effect transistor and wherein the gate voltage exceeding the threshold voltage produces a squared channel current.

5. The method of claim 3, wherein the bias current is set such that the load of the resistor multiplied by the bias current produces a threshold voltage.

6. The method of claim 4, further comprising inputting the value of the squared current into a sense amplifier to compare the value of the squared current to a value of a reference current.

7. A memristive device, comprising:
   a memristor; and
   a sense amplifier communicatively coupled to the memristor;
   wherein a sensed input current created from the application of a reference voltage across a memristor is squared; and
   wherein the sense amplifier compares the squared input current to a reference current.

8. The memristive device of claim 7, wherein squaring the input current comprises inputting the input current into an input side of a current mirror.

9. The memristive device of claim 8, wherein a bias current is added to the input current mirrored on the current mirror and the sum of the bias current and mirrored input current are passed through a resistor.

10. The memristive device of claim 9, wherein the bias current is set such that the load of the resistor multiplied by the bias current produces a threshold voltage.

11. The memristive device of claim 9, wherein the total voltage across the resistor comprises the threshold voltage and a gate voltage of a field-effect transistor and wherein the gate voltage exceeding the threshold voltage produces a squared channel current.

12. The memristive device of claim 8, wherein the interface between the memristor and the input of the current minor comprises a voltage clamp.

13. A memory device, comprising:
a memristive device;
a current minor electrically coupled to the memristive device; and
a field-effect transistor electrically coupled to the current mirror;
wherein a sensed input current through the memristive device is mirrored on the current mirror after the application of a reference voltage to the memristive device;
wherein a bias current is applied to the mirrored side of the current mirror such that a total voltage across a resistor on the mirrored side of the current mirror comprises the sum of a threshold voltage and a gate voltage of a field-effect transistor; and
wherein a resulting current through the drain of the field-effect transistor is a function of the sense current squared.

14. The memory device of claim 13, further comprising a sense amplifier to compare the resulting squared current to a reference current.

15. The memory device of claim 13, wherein the interface between the memristive device and the current mirror comprises a voltage clamp.

16. The memory device of claim 13, wherein the total voltage across the resistor comprises the threshold voltage and a gate voltage of a field-effect transistor and wherein the gate voltage exceeding the threshold voltage produces a squared channel current.

17. The memory device of claim 13, wherein the bias current is set such that the load of the resistor multiplied by the bias current produces a threshold voltage.

18. The memory device of claim 16, wherein the value of the squared current is input into a sense amplifier to compare the value of the squared current to a value of a reference current.

* * * * *